US009508634B2

(12) United States Patent
Liu

(10) Patent No.: US 9,508,634 B2
(45) Date of Patent: Nov. 29, 2016

(54) PACKAGE STRUCTURE

(71) Applicant: IBIS Innotech Inc., Taichung (TW)

(72) Inventor: Wen-Chun Liu, Taichung (TW)

(73) Assignee: IBIS Innotech Inc., Taichung (TW)

( * ) Notice: Subject to any disclaimer, the term of this patent is extended or adjusted under 35 U.S.C. 154(b) by 0 days.

(21) Appl. No.: 15/133,244

(22) Filed: Apr. 20, 2016

(65) Prior Publication Data

US 2016/0233152 A1 Aug. 11, 2016

Related U.S. Application Data

(63) Continuation-in-part of application No. 14/663,447, filed on Mar. 19, 2015.

(51) Int. Cl.
| | |
|---|---|
| *H05K 7/10* | (2006.01) |
| *H05K 7/12* | (2006.01) |
| *H01L 23/495* | (2006.01) |
| *H01L 21/768* | (2006.01) |
| *H05K 1/03* | (2006.01) |
| *H05K 3/18* | (2006.01) |

(Continued)

(52) U.S. Cl.
CPC ... *H01L 23/49586* (2013.01); *H01L 21/76823* (2013.01); *H01L 21/76825* (2013.01); *H01L 23/4952* (2013.01); *H01L 23/49541* (2013.01); *H01L 23/49558* (2013.01); *H05K 1/0373* (2013.01); *H05K 3/188* (2013.01); *H05K 3/4007* (2013.01); *H05K 1/113* (2013.01); *H05K 3/0014* (2013.01); *H05K 3/105* (2013.01); *H05K 3/4697* (2013.01); *H05K 2201/0236* (2013.01); *H05K 2201/0376* (2013.01); *H05K 2201/0919* (2013.01); *H05K 2201/09063* (2013.01); *H05K 2201/09118* (2013.01); *H05K 2201/10151* (2013.01); *H05K 2201/10515* (2013.01); *H05K 2201/10674* (2013.01)

(58) Field of Classification Search
USPC .......................... 361/767, 752, 808; 174/557
See application file for complete search history.

(56) References Cited

U.S. PATENT DOCUMENTS

| | | | |
|---|---|---|---|
| 5,201,451 A * | 4/1993 | Desai | H01L 23/4985 228/44.7 |
| 7,081,373 B2 * | 7/2006 | Roeters | H01L 23/5387 257/E23.177 |

OTHER PUBLICATIONS

Korczynski, "Wafer-level packaging of ICs for mobile systems of the future," Semiconductor Manufacturing & Designs Community, May 2014, pp. 1-5.

*Primary Examiner* — Andargie M Aychillhum
(74) *Attorney, Agent, or Firm* — Jianq Chyun IP Office

(57) ABSTRACT

A package structure includes a lead frame, a selective-electroplating epoxy compound, conductive vias and a patterned circuit layer. The lead frame includes a metal stud array having metal studs. The selective-electroplating epoxy compound covers the metal stud array. The selective-electroplating epoxy compound includes non-conductive metal complex. The conductive vias are directly embedded in the selective electroplating epoxy compound to be respectively connected to the metal studs and extended to a top surface of the selective-electroplating epoxy compound. Each of the conductive vias includes a lower segment connected to the corresponding metal stud and an upper segment connected to the lower segment and extended to the top surface, and a smallest diameter of the upper segment is greater than a largest diameter of the lower segment. The patterned circuit layer is directly disposed on the top surface and electrically connected to the conductive vias.

41 Claims, 9 Drawing Sheets

(51) Int. Cl.
  *H05K 3/40* (2006.01)
  *H05K 1/11* (2006.01)
  *H05K 3/00* (2006.01)
  *H05K 3/10* (2006.01)
  *H05K 3/46* (2006.01)

PACKAGE STRUCTURE

CROSS-REFERENCE TO RELATED APPLICATION

This application is a continuation-in-part application of and claims the priority benefit of U.S. application Ser. No. 14/663,447, filed on Mar. 19, 2015, now pending. The prior application Ser. No. 14/663,447 claims the priority benefit of Taiwan application serial no. 103121829, filed on Jun. 24, 2014. The entirety of each of the above-mentioned patent applications is hereby incorporated by reference herein and made a part of this specification.

BACKGROUND OF THE INVENTION

Field of the Invention

The present invention generally relates to a package structure. More particularly, the present invention relates to a package structure capable of forming patterned circuit layers by directly electroplating a selective electroplating epoxy compound thereof.

Description of Related Art

In the information society nowadays, people tend to rely on electronic products more and more. To meet with the requirements of high speed, high performance, and being light, thin, and compact on the electronic products nowadays, flexible circuit boards having flexibility are more commonly applied in various electronic products, such as mobile phones, notebook PCs, digital cameras, tablet PCs, printers, and disk players, etc.

Generally speaking, in production of a package structure, a pre-processing process, a sputtering process, a copper-laminating or copper-plating process and a photolithography process are performed on one or two opposite surfaces of an insulation substrate to form circuit layers thereon. However, the processes in the manufacturing method are complicated and the cost of sputtering is relatively high. Moreover, it is challenging for a patterned circuit layer formed by using a patterned dry film as an electroplating barrier to meet the requirement of fine pitch nowadays. Moreover, the insulation layer is typically made of a polyimide or an Ajinomoto build-up film (ABF) resin, which costs higher. Therefore, the package structures are currently manufactured in complicated processes with high cost.

Accordingly, how to form patterned circuit layers on a insulation material by selectively electroplating the same and how to apply the technique to the package structures have become one of the issues to be resolved for the industry.

SUMMARY OF THE INVENTION

Accordingly, the present invention is directed to a package structure capable of forming patterned circuit layers by directly electroplating or electroless plating (chemical deposition) a selective electroplating epoxy compound thereon, which contributes to simplified manufacturing process, smaller overall thickness and more flexible circuit design.

The present invention provides a package structure including a lead frame, a selective electroplating epoxy compound, a plurality of first conductive vias and a first patterned circuit layer. The lead frame includes a metal stud array having a plurality of metal studs. The selective electroplating epoxy compound covers the metal stud array and exposes a lower surface of the metal stud array, wherein the selective electroplating epoxy compound includes non-conductive metal complex. The first conductive vias are directly embedded in the selective electroplating epoxy compound to be respectively connected to the metal studs and extended to a top surface of the selective electroplating epoxy compound, wherein at least one of the first conductive vias includes a first lower segment connected to the corresponding metal stud and a first upper segment connected to the first lower segment and extended to the top surface of the selective electroplating epoxy compound, and a smallest diameter of the first upper segment is greater than a largest diameter of the first lower segment. The first patterned circuit layer is directly disposed on the top surface and electrically connected to the first conductive vias.

The present invention provides a package structure including a lead frame, a selective electroplating epoxy compound, a first patterned circuit layer, a second patterned circuit layer, at least one chip, a plurality of wires and a first conductive via. The lead frame includes a plurality of output leads. The selective electroplating epoxy compound covers the output leads and exposes a lower surface of the lead frame, wherein the selective electroplating epoxy compound includes at least one cavity and a stepped portion protruded from a bottom surface and a side surface of the cavity. The stepped portion includes a slanted surface extended from a top surface of the stepped portion to the bottom surface, and a material of the selective electroplating epoxy compound comprises non-conductive metal complex. The first patterned circuit layer is directly disposed on the top surface of the stepped portion and extended to the bottom surface of the cavity via the slanted surface. The second patterned circuit layer is directly disposed on the bottom surface of the cavity. The chip is disposed in the cavity. The wires connect the chip to the stepped portion and the bottom surface to electrically connect the chip to the first patterned circuit layer and the second patterned circuit layer. The first conductive via penetrates the selective electroplating epoxy compound to connect the first patterned circuit layer and the output leads.

In light of the foregoing, the invention utilizes the selectively electroplating characteristics of the selective-electroplating epoxy compound to form the conductive structures such as the patterned circuit layers and the conductive vias by directly electroplating the surface of the selective electroplating epoxy compound, so as to simplify manufacturing process of a package structure.

Moreover, at least one of the conductive vias includes a lower segment and an upper segment connected to each other, and a smallest diameter of the upper segment is greater than a largest diameter of the lower segment, so as to reduce the height-width ratio, as known as aspect ratio, of the conductive vias and enhance the bonding strength between the conductive vias and the selective electroplating epoxy compound. As such, the delamination between the conductive vias and the selective electroplating epoxy compound can be avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
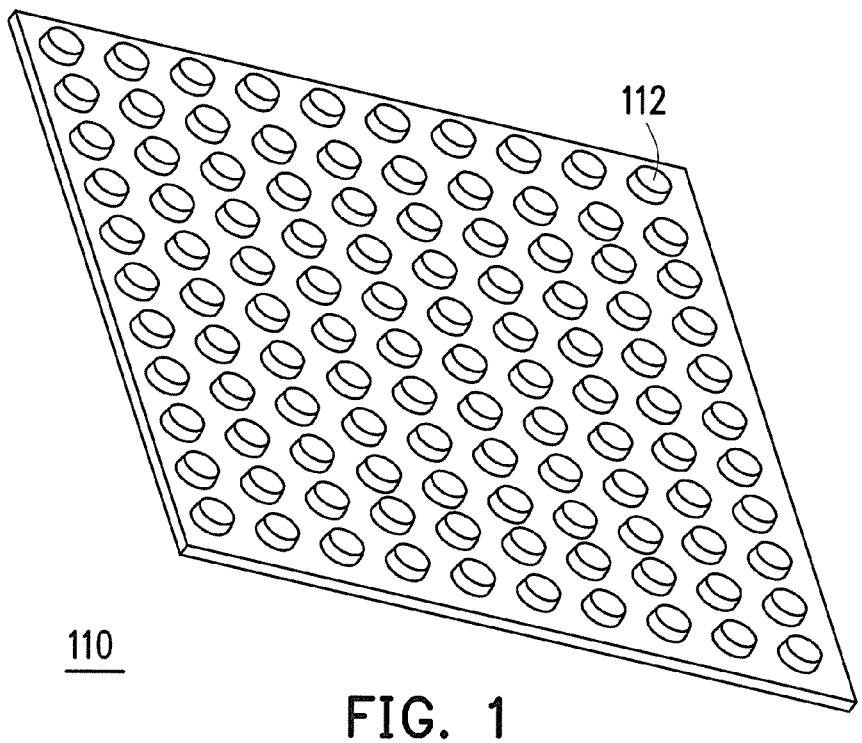
FIG. 1 is a schematic view of a lead frame according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
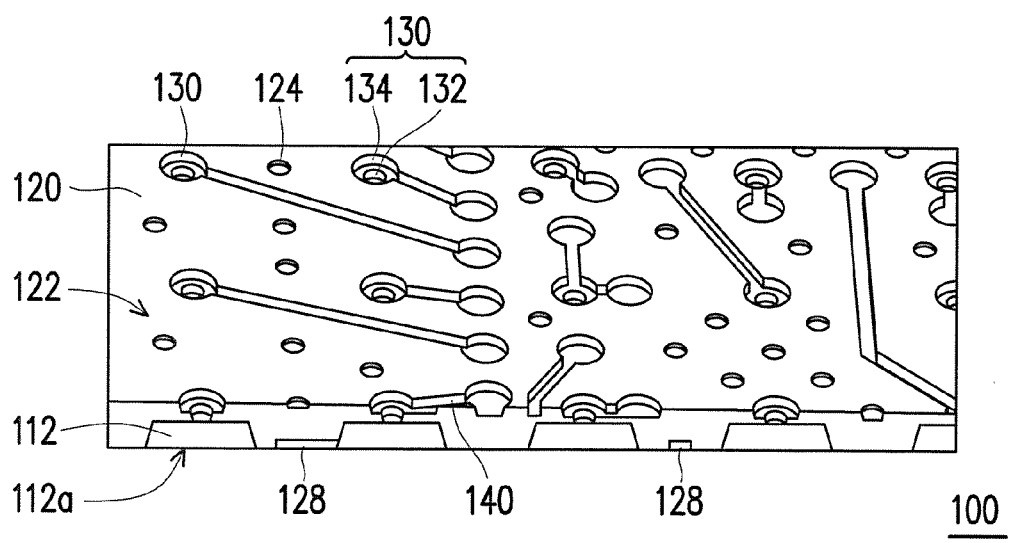
FIG. 2 is a schematic view of a package structure according to an embodiment of the invention.
Figure 3:
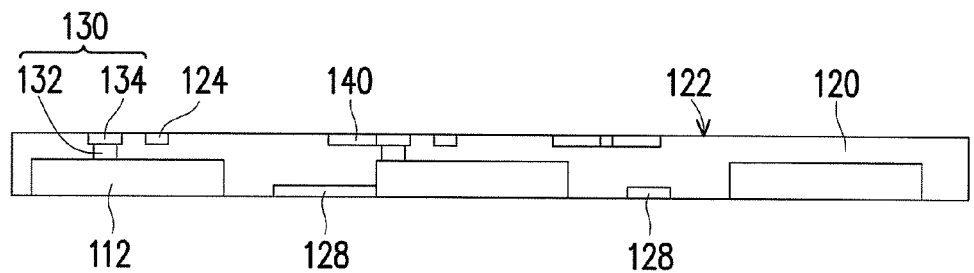
FIG. 3 is a partial cross-sectional view of a package structure according to an embodiment of the invention.

FIG. 1 is a schematic view of a lead frame according to an embodiment of the invention. FIG. 2 is a schematic view of a package structure according to an embodiment of the invention. FIG. 3 is a partial cross-sectional view of a package structure according to an embodiment of the invention. Referring to FIG. 1 to FIG. 3, the package structure 100 in the present embodiment includes a lead frame 110, a selective electroplating epoxy compound 120, a plurality of first conductive vias 130 and a first patterned circuit layer 140. The lead frame 110 as shown in FIG. 1 is firstly provided and includes a metal stud array having a plurality of metal studs 112 arranged in an array manner.

The lead frame 110 shown in FIG. 1 may be formed by the following steps. Firstly, a metal substrate may be provided. Then, a patterned photo-resist layers is formed on a top surface of the metal substrate. Next, a half etching process is performed on the top surface of the metal substrate by employing one of the patterned photo-resist layers as an etching barrier to form the lead frame 110 illustrated in FIG. 1, which has a plurality of metal studs 112 connected with each other at the bottom.

Then, the selective electroplating epoxy compound 120 is formed to cover the metal stud array as shown in FIG. 2, wherein the selective electroplating epoxy compound 120 includes non-conductive metal complex. After the selective electroplating epoxy compound 120 is formed to cover the metal stud array, another half etching process is then performed on the bottom surface of the lead frame 110 to remove the bottom part of the lead frame to form the metal studs 112 separated from each other and arranged in an array as shown in FIG. 2, so that the selective electroplating epoxy compound 120 exposes a lower surface of the metal stud array 112a.

The first conductive vias 130 are directly embedded in the selective electroplating epoxy compound 120 to be respectively connected to the metal studs 112 and extended to a top surface 122 of the selective electroplating epoxy compound 120. In the present embodiment, the first conductive vias 130 are directly formed by utilizing the selectively electroplating characteristic of the selective electroplating epoxy compound 120, such that first conductive vias 130 is directly embedded in the top surface 122 of the selective electroplating epoxy compound 120 and electrically connected with the corresponding metal studs 112. Specifically, in the present embodiment, the selective electroplating epoxy compound 120 includes non-conductive metal complex, and the non-conductive metal complex may include palladium (Pd), chromium, or copper complex.

In detail, the step of forming the first conductive vias 130 by selectively electroplating the selective electroplating epoxy compound 120 may include the following steps. A plurality of vias corresponding to the position of the first conductive vias 130 are carved on the top surface 122 of the selective electroplating epoxy compound 120 by laser drilling, such that the non-conductive metal complex in the vias is damaged by laser to release heavy metal nuclei which is highly active in metal reduction. In the present embodiment, the selective electroplating epoxy compound 120 can be selectively irradiated by laser or ultraviolet (UV) light to selectively metallize the non-conductive metal complex, so that the selective electroplating epoxy compound 120 can be carved and metallized at the same time, and the selective electroplating epoxy compound 120 can be selective electroplated to form the first conductive vias 130 by direct electroplating.

In addition, due to the technical limitation on laser drilling process, the height-width ratio of the conductive via formed by laser drilling is generally limited to 3:1 at most. Therefore, it is hard to reduce the diameter of the conductive via when the desired depth of the conductive via is rather deep. Accordingly, in the present embodiment, the first conductive vias 130 is formed by at least two separate laser drilling processes, so as to reduce the laser drilling depth of each laser drilling process, and the diameters of the first conductive vias 130 can be effectively reduced, so the density of the circuit layout can be improved. Certainly, the first conductive vias 130 may be formed by more than two separate laser drilling processes to obtain a deeper conductive vias with smaller diameter. The present embodiment does not limit the number of the laser drilling process is adopted to form one conductive via.

By forming the first conductive vias 130 with the process described above, each of the first conductive vias 130 may have a stepped profile. To be more specific, at least one of the first conductive vias 130 includes a first lower segment 132 connected to the corresponding metal stud 112 and a first upper segment 134 connected to the first lower segment 132 and directly or indirectly extended to the top surface 122, and a smallest diameter of the first upper segment 134 is greater than a largest diameter of the first lower segment 132 as shown in FIG. 3. As such, the first conductive vias 130 not only have smaller outer diameters, but also enhance the bonding strength with the selective electroplating epoxy compound 120 owing to the stepped profile thereof, so as to avoid delamination between the first conductive vias 130 and the selective electroplating epoxy compound 120 due to thermal expansion coefficient differences between metal and epoxy.

The first patterned circuit layer 140 is directly disposed on the top surface 122 and electrically connected to the first conductive vias 130. In the present embodiment, the first patterned circuit layer 140 is formed by the same manufacturing process as the first conductive vias 130, so the first patterned circuit layer 140 is embedded in the top surface 122 of the selective electroplating epoxy compound 120, and the selective electroplating epoxy compound 120 exposes a top surface of the first patterned circuit layer 140. Specifically, the circuit trench corresponding to the first patterned circuit layer 140 is carved directly on the top surface 122 of the selective electroplating epoxy compound 120 by laser, so the first patterned circuit layer 140 can be formed in the circuit trench by direct electroplating. Thereby, the top surface of the first patterned circuit layer 140 may be lower than or coplanar with the top surface 122 of the selective electroplating epoxy compound 120. Certainly, the present embodiment is merely an example for illustration, but not intended to limit the invention.

Figure 4:
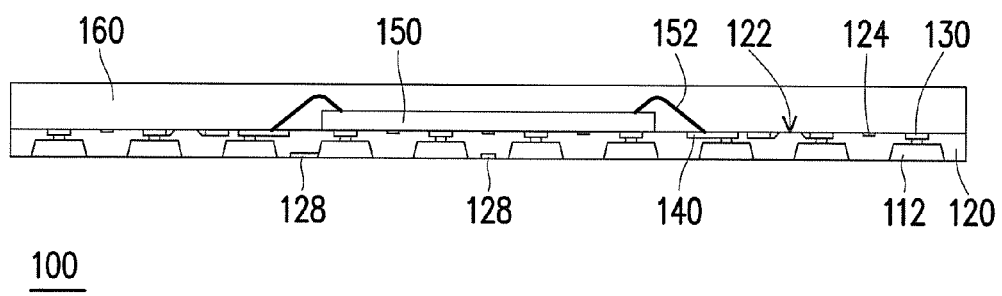
FIG. 4 is a cross-sectional view of a package structure according to an embodiment of the invention.
Figure 4A:
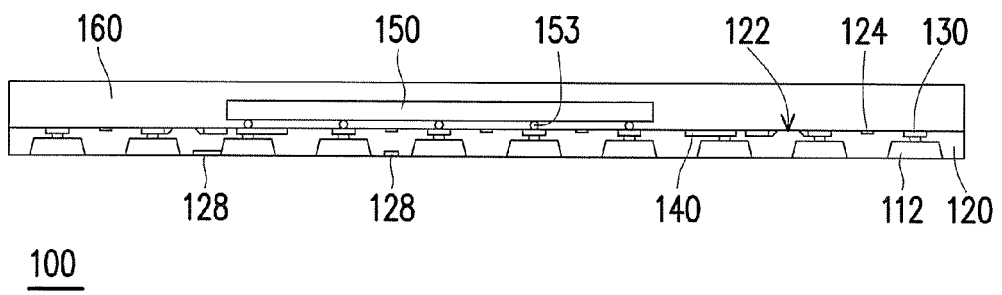
FIG. 4A is a cross-sectional view of a package structure according to another embodiment of the invention.
Figure 5:
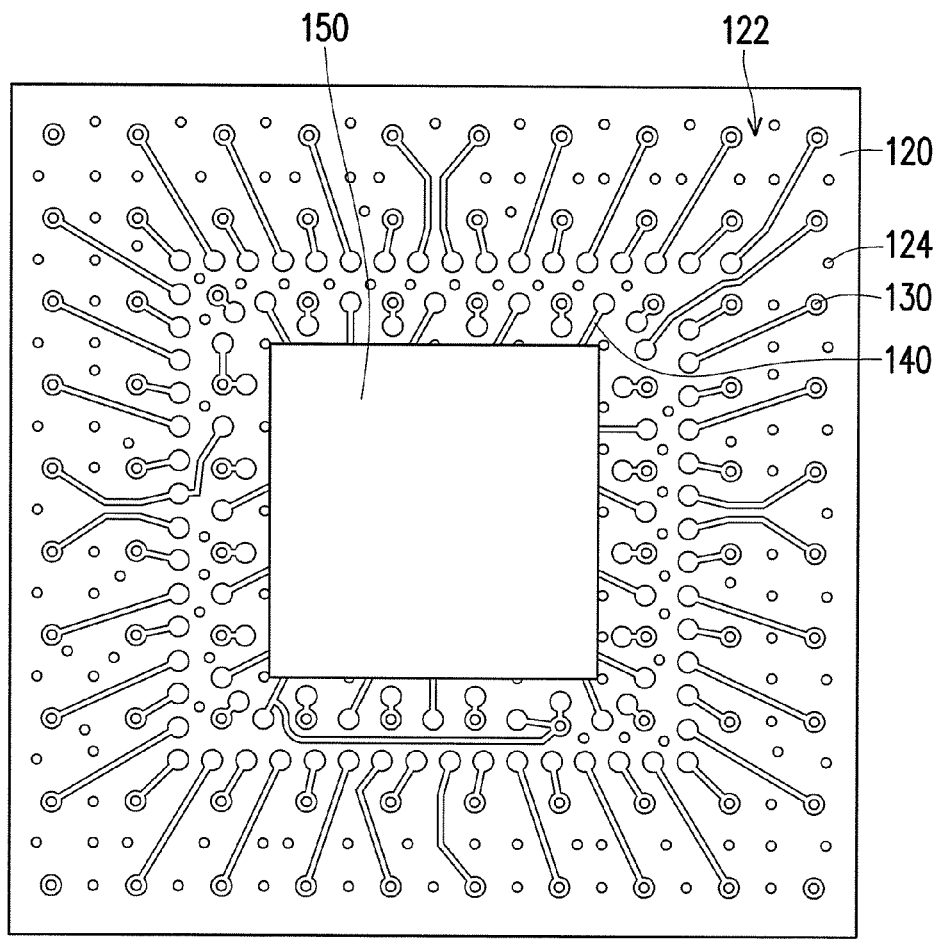
FIG. 5 is a top view of the package structure in FIG. 4.

FIG. 4 is a cross-sectional view of a package structure according to an embodiment of the invention. FIG. 4A is a cross-sectional view of a package structure according to another embodiment of the invention. FIG. 5 is a top view of the package structure in FIG. 4. Referring to FIG. 4, FIG. 4A and FIG. 5, in the present embodiment, the package structure 100 may further include at least a chip 150 disposed on the top surface 122 of the selective electroplating epoxy compound 120 and electrically connected to the first conductive vias 130 and the first patterned circuit layer 140. To be more specific, the chip 150 may be electrically connected to the first patterned circuit layer 140 by wire bonding or flip chip direct attach. Namely, a plurality of wires 152 as shown in FIG. 4 or/and a plurality of metal bumps 153 as shown in FIG. 4A may be adopted to be electrically connected between the chip or chips and the first patterned circuit layer 140 connecting the first conductive vias 130. It is noted that, for simplicity and clarity of the figure, the wires 152 and metal bumps 153 are omitted in FIG. 5.

Moreover, the selective electroplating epoxy compound 120 may include a plurality of dimples 124 located on the top surface 122 of the selective electroplating epoxy compound 120, and the package structure 100 may further include a molding compound 160 covering the top surface 122 of the selective electroplating epoxy compound 120 and filled in the dimples 124. Thereby, the bonding strength between the selective electroplating epoxy compound 120 and the molding compound 160 can be enhanced, so as to avoid delamination between the selective electroplating epoxy compound 120 and the molding compound 160. In the present embodiment, the inner surface of the dimple 124 can be electroplated with metal layer according to the required bonding strength. The number of the dimples 124 is not limited in the present invention. It is noted that the material of molding compound 160 can be the same as the material of the selective electroplating epoxy compound 120 or the insulation material. The molding compound 160 may also include non-conductive metal complex and capable of being selective electroplated, but the present embodiment is not limited thereto. In addition, the package structure 100 may further include a bottom patterned circuit layer 128 directly disposed on a bottom surface of the selective electroplating epoxy compound 120 and electrically connected to the metal stud array as shown in FIG. 4 and FIG. 4A.

Figure 6:
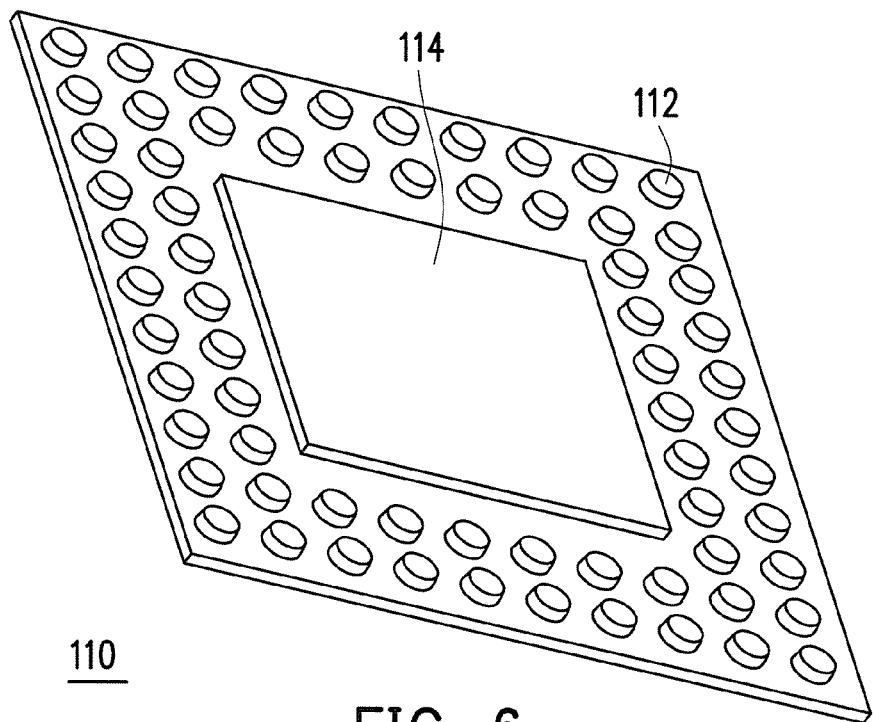
FIG. 6 is a schematic view of a lead frame according to an embodiment of the invention.
Figure 7:
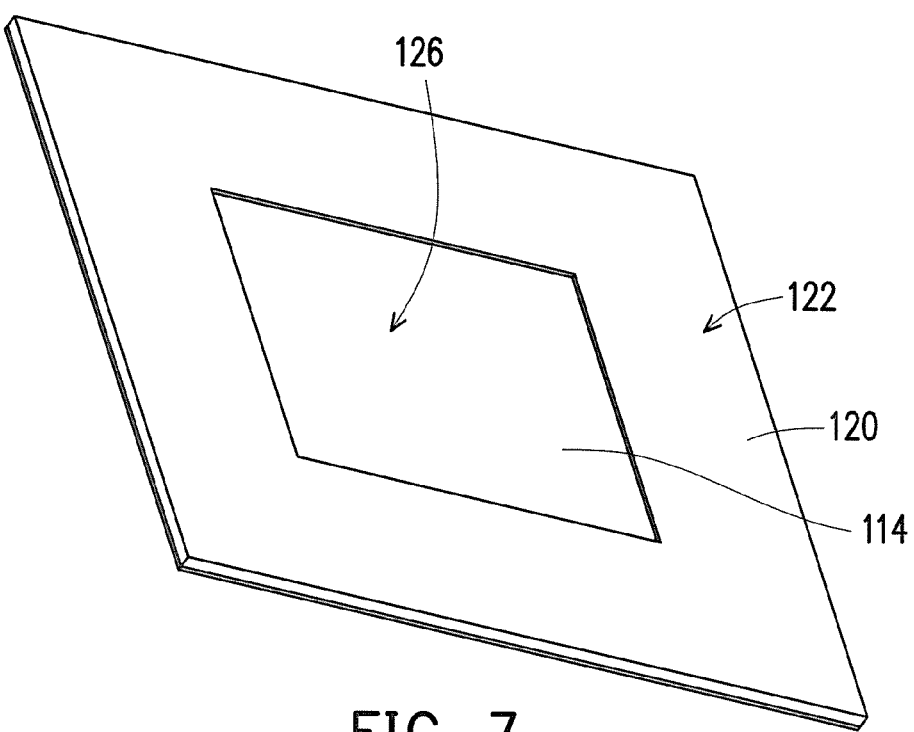
FIG. 7 is a schematic view of a package structure according to an embodiment of the invention.
Figure 8:
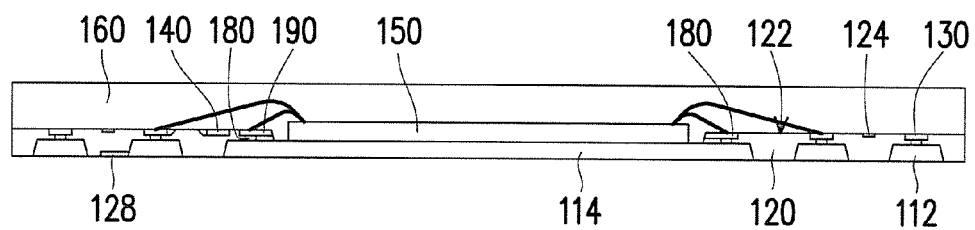
FIG. 8 is a cross-sectional view of a package structure according to an embodiment of the invention.
Figure 8A:
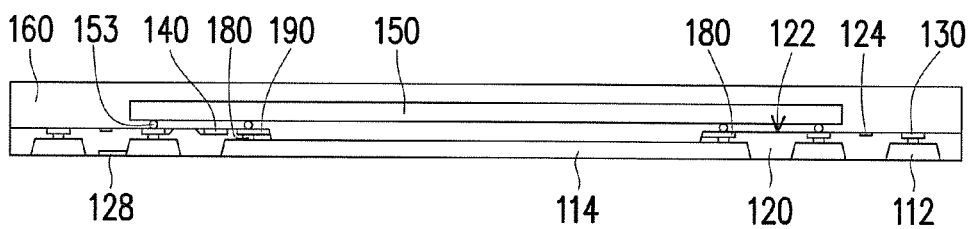
FIG. 8A is a cross-sectional view of a package structure according to another embodiment of the invention.

FIG. 6 is a schematic view of a lead frame according to an embodiment of the invention. FIG. 7 is a schematic view of a package structure according to an embodiment of the invention. FIG. 8 is a cross-sectional view of a package structure according to an embodiment of the invention. FIG. 8A is a cross-sectional view of a package structure according to another embodiment of the invention. It is noted that the package structure 100a shown in FIG. 8 and FIG. 8A contains many features same as or similar to the package structure 100 in the previous embodiments. Wherever possible, the same or similar reference numbers are used in the drawings and the description to refer to the same or similar parts. For purpose of clarity and simplicity, detail description of same or similar features may be omitted. The main differences between the package structure 100a and the package structure 100 are described as follows.

Referring to FIG. 6 to FIG. 8A, in the present embodiment, the lead frame 110 further includes a chip pad 114 as shown in FIG. 6. The metal studs 112 surround the chip pad 114. The selective electroplating epoxy compound 120 is formed to cover the metal studs 112 and further includes an opening 126 located on the top surface 122 of the selective electroplating epoxy compound 120, and the opening 126 at least partially exposes an upper surface of the chip pad 114 as shown in FIG. 7. After the selective electroplating epoxy compound 120 is formed (preferably after the molding compound 160 is formed), a half etching process is then performed on the bottom surface of the lead frame 110 to remove the bottom part of the lead frame 110, such that the selective electroplating epoxy compound 120 exposes the lower surface of the metal stud array, and a lower surface of the chip pad 114 is coplanar with the lower surface of the metal stud array as shown in FIG. 8. In the present embodiment, the upper surface of the chip pad 114 is lower than the top surface 122 of the selective electroplating epoxy compound 120, and the upper surface of the chip pad 114 is coplanar with an upper surface of the metal stud array.

In the present embodiment, the package structure 100a may further include at least a chip 150 disposed on the chip pad 114 and located in the opening 126. The chip 150 is electrically connected to the first conductive vias 130 and the first patterned circuit layer 140. Specifically, the chip 150 may be electrically connected to the first patterned circuit layer 140 by wire bonding as shown in FIG. 8 or flip chip direct attach as shown in FIG. 8A. To be more specific, the package structure 100a may further include a plurality of second conducive vias 180 and a second patterned circuit layer 190, the selective electroplating epoxy compound 120 covers a peripheral region of the chip pad 114, and the second conductive vias 180 are embedded in the selective electroplating epoxy compound 120 and connected to the peripheral region of the chip pad 114 as shown in FIG. 8 and FIG. 8A.

In the present embodiment, the second conductive vias 180 can be formed by the same process. Namely, the second conductive vias 180 is formed by at least two separate laser drilling processes to reduce the outer diameters of the second conductive vias 180. As such, at least one the second conductive vias 180 may also have a stepped profile, which includes a second lower segment connected to the peripheral region of the chip pad 114 and a second upper segment connected to the second lower segment and directly or indirectly extended to the top surface 122, and a smallest diameter of the second upper segment is greater than a largest diameter of the second lower segment as shown in FIG. 8. Therefore, the second conductive vias 180 not only have smaller outer diameters, but also enhance the bonding strength with the selective electroplating epoxy compound 120, so as to avoid delamination between the second conductive vias 180 and the selective electroplating epoxy compound 120.

In addition, the second patterned circuit layer 190 is directly disposed on the top surface 122 and electrically connected to the second conductive vias 180. In the present embodiment, the second conductive vias 180 surround the peripheral region of the chip pad 114 to form a power ring or ground ring, and the chip 150 may be electrically connected to both the second patterned circuit layer 190 and the first patterned circuit layer 140 through wire bonding as shown in FIG. 8 or flip chip direct attach as shown in FIG. 8A. The stepped shapes of the conductive vias 130 and 180 and the connection of the patterned circuit layers 140 and 190 can keep the conductive vias 130 and 180 from delaminated from the selective electroplating epoxy compound 120 also enhance 120 adhesion strength with the chip pad 114.

In the present embodiment, the selective electroplating epoxy compound 120 may also include a plurality of dimples 124 located on the top surface 122 of the selective electroplating epoxy compound 120, and the package structure 100a may further include a molding compound 160 covering the top surface 122 of the selective electroplating epoxy compound 120 and filled in the dimples 124 to enhance the bonding strength between the selective electroplating epoxy compound 120 and the molding compound 160 or insulation material. Similarly, the material of molding compound 160 can be the same as the material of the selective electroplating epoxy compound 120. Namely, the molding compound 160 may also include non-conductive metal complex and capable of being selective electroplated, but the present embodiment is not limited thereto. In addition, the package structure 100a may further include a bottom patterned circuit layer 128 directly disposed on a bottom surface of the selective electroplating epoxy compound 120 and electrically connected to the metal stud array as shown in FIG. 8 and FIG. 8A.

Figure 9:
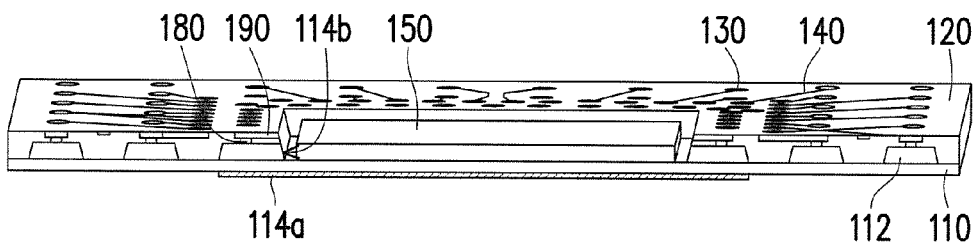
FIG. 9 and FIG. 10 illustrating a manufacturing process of a package structure according to an embodiment of the invention.
Figure 10:
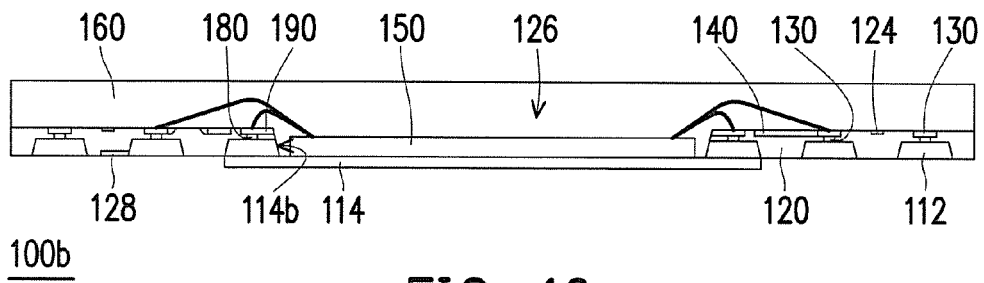
Figure 10A:
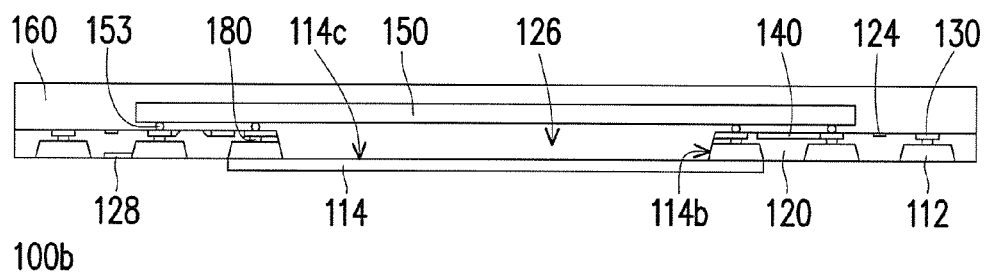
FIG. 10A illustrating a cross-sectional view of a package structure according to another embodiment of the invention.

FIG. 9 and FIG. 10 illustrating a manufacturing process of a package structure according to an embodiment of the invention. FIG. 10A is a cross-sectional view of a package structure according to another embodiment of the invention. It is noted that the package structure 100b shown in FIG. 10 and FIG. 10A contains many features same as or similar to the package structure 100a in the previous embodiments. Wherever possible, the same or similar reference numbers are used in the drawings and the description to refer to the same or similar parts. For purpose of clarity and simplicity, detail description of same or similar features may be omitted. The main differences between the package structure 100b and the package structure 100a are described as follows.

Referring to FIG. 9 and FIG. 10, in the present embodiment, the lead frame 110 may also includes a chip pad 114. The chip pad 114 includes a concave 114b, a bottom surface 114c of the concave 114b is coplanar with the lower surface of the metal stud array as shown in FIG. 10. The manufacturing process of the lead frame 110 in the present embodiment may include the following steps. A lead frame 110 includes a plurality of metal studs 112 and a chip pad block having the concave 114b is firstly provided, and the metal studs 112 surround the chip pad block as shown in FIG. 9. Then, the selective electroplating epoxy compound 120 is formed to cover the metal studs 112 and further includes an opening 126 located on the top surface 122 of the selective electroplating epoxy compound 120 and exposes the bottom surface of the concave 114b. The metal studs 112 surround the opening 126. After the selective electroplating epoxy compound 120 is formed, an etching resist layer 114a as show in FIG. 9 is formed to cover a part of the bottom surface of the lead frame 110, and the part of the bottom surface covered by the etching resist layer 114a is corresponding to the chip pad 114 shown in FIG. 10. Then (preferably after the molding compound 160 is formed), a half etching process is then performed on the bottom surface of the lead frame 110 to remove the bottom part of the lead frame 110 except the part covered by the etching resist layer 114a, so as to form the chip pad 114 as shown in FIG. 10.

As such, the bottom surface 114c of the concave 114b is coplanar with the lower surface of the metal stud array as shown in FIG. 10. The selective electroplating epoxy compound 120 covers a peripheral region of the chip pad 114, the peripheral region of the chip pad 114 surrounds the concave 114b, which is aligned with the opening 126. In the present embodiment, the package structure 100b may further include at least a chip 150 disposed in the concave 114b, and the chip 150 is electrically connected to the first conductive vias 130 and the first patterned circuit layer 140 by wire bonding as shown in FIG. 10 or flip chip direct attach as shown in FIG. 10A. In addition, the package structure 100b may further include a bottom patterned circuit layer 128 directly disposed on a bottom surface of the selective electroplating epoxy compound 120 and electrically connected to the metal stud array as shown in FIG. 10 and FIG. 10A.

In the present embodiment, the package structure 100b may further include a plurality of second conducive vias 180 and a second patterned circuit layer 190, the selective electroplating epoxy compound 120 covers a peripheral region of the chip pad 114 surrounding the concave 114b, and the second conductive vias 180 are embedded in the selective electroplating epoxy compound 120 and connected to the peripheral region of the chip pad 114 as shown in FIG. 10 and FIG. 10A.

In the present embodiment, the second conductive vias 180 can be formed by the same process. Namely, the second conductive vias 180 is formed by at least two separate laser drilling processes to reduce the outer diameters of the second conductive vias 180. As such, at least one the second conductive vias 180 may also have a stepped profile, which includes a second lower segment connected to the peripheral region of the chip pad 114 and a second upper segment connected to the second lower segment and directly or indirectly extended to the top surface 122, and a smallest diameter of the second upper segment is greater than a largest diameter of the second lower segment as shown in FIG. 10 and FIG. 10A. Therefore, the second conductive vias 180 not only have smaller outer diameters, but also enhance the bonding strength with the selective electroplating epoxy compound 120, so as to avoid delamination between the second conductive vias 180 and the selective electroplating epoxy compound 120.

In addition, the second patterned circuit layer 190 is directly disposed on the top surface 122 and electrically connected to the second conductive vias 180. In the present embodiment, the second conductive vias 180 surround the peripheral region of the chip pad 114 to form a power ring or ground ring, and the chip 150 may be electrically connected to both the second patterned circuit layer 190 and the first patterned circuit layer 140 through wire bonding as shown in FIG. 10 or flip chip direct attach as shown in FIG. 10A.

Similarly, the selective electroplating epoxy compound 120 may also include a plurality of dimples 124 located on the top surface 122 of the selective electroplating epoxy compound 120, and the package structure 100b may further include a molding compound 160 or insulation material covering the top surface 122 of the selective electroplating epoxy compound 120 and filled in the dimples 124 to enhance the bonding strength between the selective electroplating epoxy compound 120 and the molding compound 160 or insulation material. Accordingly, since the upper surface of the chip pad 114 is coplanar with the bottom surfaces of the metal studs 112, the overall thickness of the package structure 100b can be further reduced.

Figure 11:
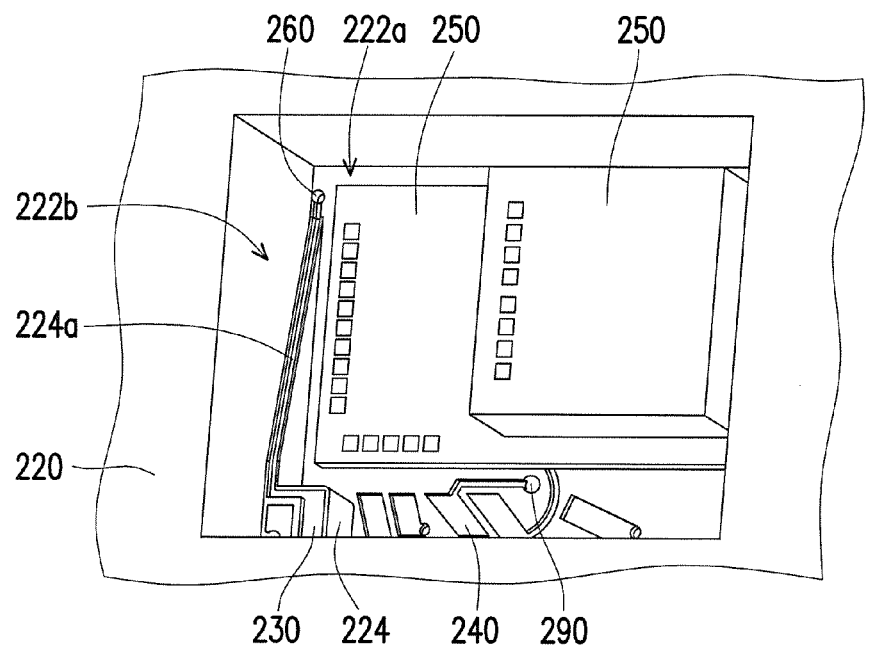
FIG. 11 is a schematic view of a package structure according to an embodiment of the invention.
Figure 12:
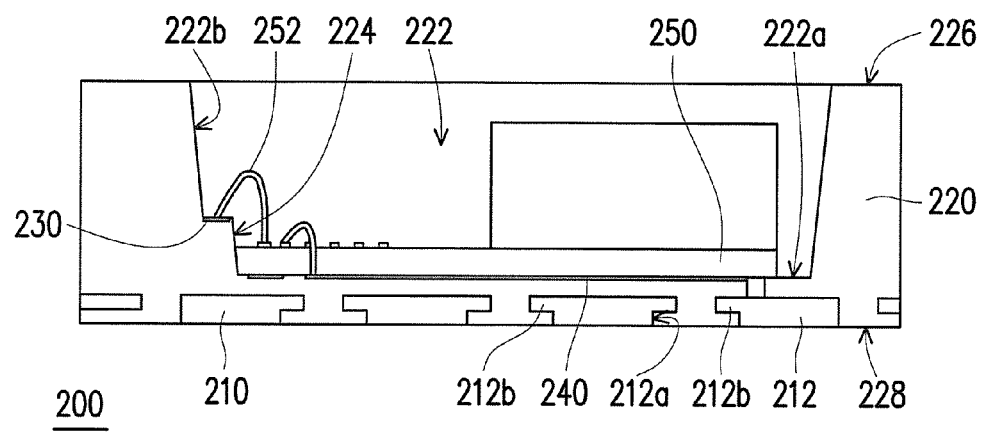
FIG. 12 is a cross-sectional view of the package structure in FIG. 11.
Figure 13:
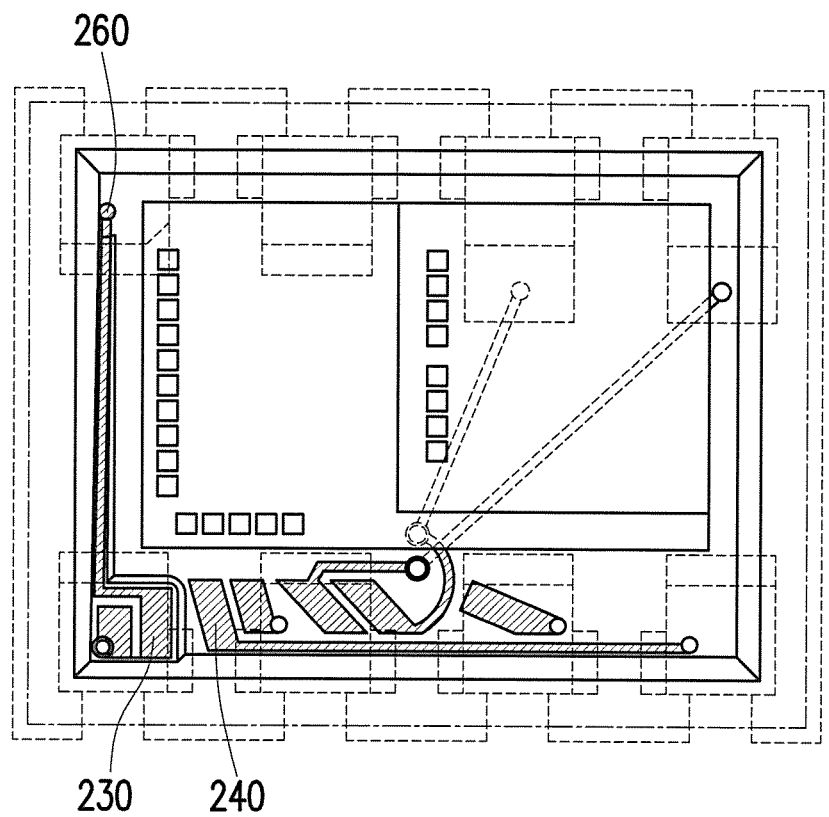
FIG. 13 is a top view of the package structure in FIG. 11.
Figure 14:
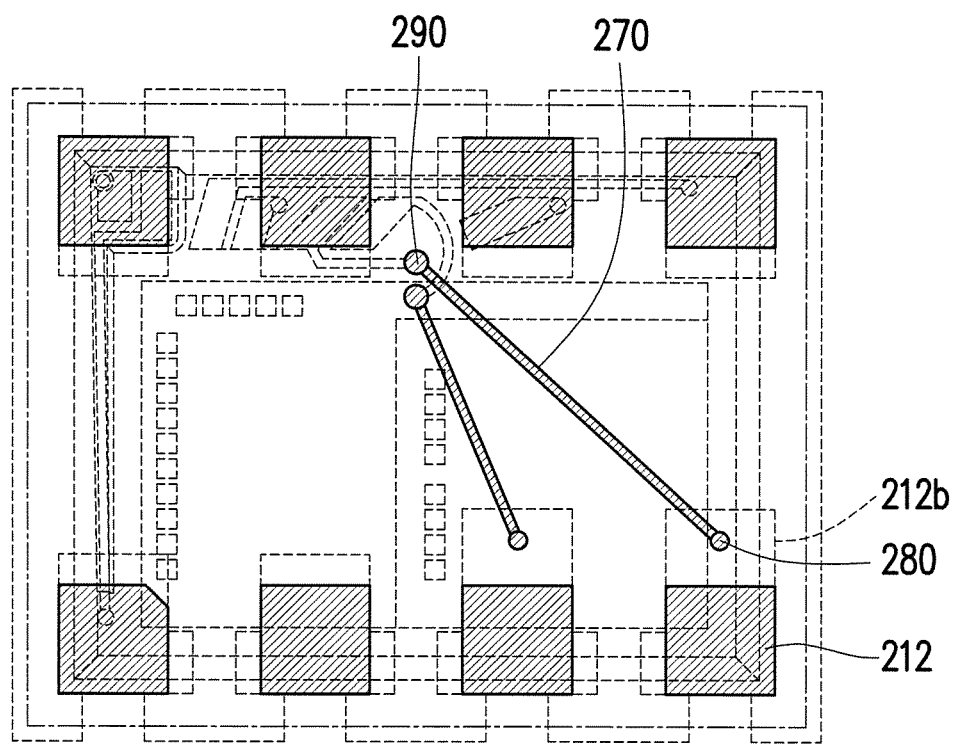
FIG. 14 is a bottom view of the package structure in FIG. 11.

FIG. 11 is a schematic view of a package structure according to an embodiment of the invention. FIG. 12 is a cross-sectional view of the package structure in FIG. 11. FIG. 13 is a top view of the package structure in FIG. 11. FIG. 14 is a bottom view of the package structure in FIG. 11. It is noted that the package structure 200 shown in FIG. 11 to FIG. 14 contains many features same as or similar to the package structure 100a in the previous embodiments. Wherever possible, the same reference numbers are used in the drawings and the description to refer to the same or similar parts. For purpose of clarity and simplicity, detail description of same or similar features may be omitted. The main differences between the package structure 200 and the package structure 100a are described as follows.

Referring to FIG. 11 and FIG. 12, in the present embodiment, a package structure 200 includes a lead frame 210, a selective electroplating epoxy compound 220, a first patterned circuit layer 230, a second patterned circuit layer 240, at least one chip 250, a plurality of wires 252 and a first conductive via 260. The lead frame 210 includes a plurality of output leads 212. A material of the selective electroplating epoxy compound 220 is the same as the material of the selective electroplating epoxy compound 120 in the previous embodiments. Namely, the selective electroplating epoxy compound 220 may also include non-conductive metal complex and capable of being selective electroplated, but the present embodiment is not limited thereto.

The selective electroplating epoxy compound 220 covers the output leads 212 and exposes a lower surface of the lead frame 210. The selective electroplating epoxy compound 220 includes at least a cavity 222 and a stepped portion 224 protruded from a bottom surface 222a and a side surface 222b of the cavity 222 as shown in FIG. 11. The stepped portion 224 includes a slanted surface 224a, which is extended from a top surface of the stepped portion 224 to the bottom surface 222a of the cavity 222. The first patterned circuit layer 230 is directly disposed on the top surface of the stepped portion 224 and extended to the bottom surface 222a of the cavity 222 through the slanted surface 224a as shown in FIG. 11. The second patterned circuit layer 240 is directly disposed on the bottom surface 222a of the cavity 222. The chip 250 is disposed in the cavity 222. The wires 252 connect the chip 250 to the stepped portion 224 and the bottom surface 222a to electrically connect the chip 250 to the first patterned circuit layer 230 and the second patterned circuit layer 240 as shown in FIG. 12. The first conductive via 260 penetrates the selective electroplating epoxy compound 220 to connect the first patterned circuit layer 230 and the output leads 212. In other embodiment, the chip 250 may also be electrically connected to the second patterned circuit layer 240 by flip chip direct attach.

With the configuration of the stepped portion 224, the problem of the wires 252 being tangled with each other can be avoided. The selective electroplating epoxy compound 220 can be shaped by a premade mold, so it is easy to form the selective electroplating epoxy compound 220 with cavity 222 and stepped portion 224, and the first patterned circuit layer 230 and the second patterned circuit layer 240 can be directly formed on the selective electroplating epoxy compound 220 by direct electroplating. In addition, due to the space limitation, the first patterned circuit layer 230 can be extended from the top surface of the stepped portion 224 to the bottom surface 222a of the cavity 222 through the slanted surface 224a. Therefore, with such configuration, the present embodiment improves the electrical performance of the package structure 200, increases the yield rate and simplifies the manufacturing process.

Moreover, referring to FIG. 12 to FIG. 14, in the present embodiment, the package structure 200 further includes a third patterned circuit layer 270 and at least one second conductive via 280 as shown in FIG. 14. The selective electroplating epoxy compound 220 includes a first surface 226 and a second surface 228 opposite to the first surface 226. The cavity 222 is disposed on the first surface 226 and the third patterned circuit layer 270 is directly disposed on the second surface 228 and electrically connected to at least one of the output leads 212. In detail, each of the output leads 212 includes a flange portion 212b protruded from a side surface 212a of the corresponding output lead 212, and at least one second conductive via 280 penetrates the selective electroplating epoxy compound 220 to connect the third patterned circuit layer 270 to one of the flange portions 212b. By disposing some circuit (the third patterned circuit layer 270) at the bottom surface (second surface 228) of the selective electroplating epoxy compound 220, the signals interfering between the circuit can be reduced. Also, the second conductive via 280 is adopted to connect the third patterned circuit layer 270 to the corresponding flange portion 212b instead of directly connecting the third patterned circuit layer 270 to the output leads 212, so as to avoid solder overflow. In the present embodiment, the package structure 200 may further include at least one third conductive via 290 penetrating the selective electroplating epoxy compound 220 to connect the second patterned circuit layer 240 and the third patterned circuit layer 270. Therefore, the present embodiment improves the electrical performance of the package structure 200, increases the yield rate and simplifies the manufacturing process.

In sum, the invention utilizes the selectively electroplating characteristics of the selective-electroplating epoxy compound to form the conductive structures such as the patterned circuit layers and the conductive vias by directly electroplating the surface of the selective electroplating epoxy compound, so as to simplify manufacturing process of a package structure. Moreover, at least one of the conductive vias includes a lower segment and an upper segment connected to each other, and a smallest diameter of the upper segment is greater than a largest diameter of the lower segment, so as to improve the height-width ratio of the conductive vias and enhance the bonding strength between the conductive vias and the selective electroplating epoxy compound. As such, the delamination between the conductive vias and the selective electroplating epoxy compound can be avoided.

In addition, the selective electroplating epoxy compound can be shaped by a premade mold, so it is easy to form the selective electroplating epoxy compound with the cavity for disposing chip and the stepped portion for wire bonding and circuit layout. Therefore, the present invention improves the electrical performance of the package structure, increases the yield rate and further simplifies the manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
   a lead frame comprising a metal stud array having a plurality of metal studs;
   a selective electroplating epoxy compound covering the metal stud array and exposing a lower surface of the metal stud array, wherein the selective electroplating epoxy compound comprises non-conductive metal complex;
   a plurality of first conductive vias directly embedded in the selective electroplating epoxy compound to be respectively connected to the metal studs and extended to a top surface of the selective electroplating epoxy compound, wherein at least one the first conductive vias comprises a first lower segment connected to the corresponding metal stud and a first upper segment connected to the first lower segment and extended to the top surface of the selective electroplating epoxy compound, and a smallest diameter of the first upper segment is greater than a largest diameter of the first lower segment; and
   a first patterned circuit layer directly disposed on the top surface and electrically connected to the first conductive vias.

2. The package structure as claimed in claim 1, wherein the non-conductive metal complex comprises palladium (Pd), chromium, or copper complex.

3. The package structure as claimed in claim 1, wherein the selective electroplating epoxy compound is configured to be selectively irradiated by laser or ultraviolet (UV) light to selectively metallize the non-conductive metal complex.

4. The package structure as claimed in claim 1, further comprising at least one chip disposed on the top surface of the selective electroplating epoxy compound and electrically connected to the first conductive vias and the first patterned circuit layer.

5. The package structure as claimed in claim 4, wherein the chip is electrically connected to the first patterned circuit layer by wire bonding or flip chip direct attach.

6. The package structure as claimed in claim 4, wherein the selective electroplating epoxy compound comprises a plurality of dimples located on the top surface of the selective electroplating epoxy compound.

7. The package structure as claimed in claim 6, further comprising a molding compound covering the top surface of the selective electroplating epoxy compound and filled in the dimples.

8. The package structure as claimed in claim 1, wherein the first patterned circuit layer is embedded in the top surface of the selective electroplating epoxy compound.

9. The package structure as claimed in claim 1, further comprising a bottom patterned circuit layer disposed on a bottom surface of the selective electroplating epoxy compound and electrically connected to the metal stud array.

10. The package structure as claimed in claim 1, wherein the lead frame further comprises a chip pad, the metal studs surround the chip pad and a lower surface of the chip pad is coplanar with the lower surface of the metal stud array.

11. The package structure as claimed in claim 10, wherein the selective electroplating epoxy compound further comprises an opening located on the top surface and at least partially exposing an upper surface of the chip pad.

12. The package structure as claimed in claim 11, wherein the upper surface of the chip pad is lower than the top surface of the selective electroplating epoxy compound, and is coplanar with an upper surface of the metal stud array.

13. The package structure as claimed in claim 11, further comprising a molding compound covering the top surface of the selective electroplating epoxy compound.

14. The package structure as claimed in claim 13, wherein the selective electroplating epoxy compound comprises a plurality of dimples located on the top surface of the selective electroplating epoxy compound and the molding compound is filled in the dimples.

15. The package structure as claimed in claim 11, further comprising a plurality of second conducive vias, the selective electroplating epoxy compound covers a peripheral region of the chip pad, and the second conductive vias are embedded in the selective electroplating epoxy compound and connected to the peripheral region of the chip pad.

16. The package structure as claimed in claim 15, wherein at least one of the second conducive vias comprises a second lower segment connected to the peripheral region of the chip pad and a second upper segment connected to the second lower segment and extended to the top surface, and a smallest diameter of the second upper segment is greater than a largest diameter of the second lower segment.

17. The package structure as claimed in claim 15, further comprising a second patterned circuit layer directly disposed on the top surface and electrically connected to the second conductive vias.

18. The package structure as claimed in claim 17, further comprising at least one chip disposed on the chip pad and located in the opening, wherein the chip is electrically connected to the second patterned circuit layer by wire bonding or flip chip direct attach.

19. The package structure as claimed in claim 11, further comprising at least one chip disposed on the chip pad and located in the opening, wherein the chip is electrically connected to the first conductive vias and the first patterned circuit layer.

20. The package structure as claimed in claim 19, wherein the chip is electrically connected to the first patterned circuit layer by wire bonding or flip chip direct attach.

21. The package structure as claimed in claim 11, further comprising a bottom patterned circuit layer disposed on a bottom surface of the selective electroplating epoxy compound and electrically connected to the metal stud array.

22. The package structure as claimed in claim 1, wherein the lead frame further comprises a chip pad, the chip pad comprises a concave, a bottom surface of the concave is coplanar with the lower surface of the metal stud array.

23. The package structure as claimed in claim 22, wherein the selective electroplating epoxy compound further comprises an opening located on the top surface and exposes the bottom surface of the concave, and the metal studs surrounds the chip pad.

24. The package structure as claimed in claim 23, wherein the selective electroplating epoxy compound covers a peripheral region of the chip pad, and a bottom surface of the chip pad protrudes from a bottom surface of the selective electroplating epoxy compound.

25. The package structure as claimed in claim 23, further comprising at least one chip disposed in the concave, wherein the chip is electrically connected to the first conductive vias and the first patterned circuit layer.

26. The package structure as claimed in claim 25, wherein the chip is electrically connected to the first patterned circuit layer by wire bonding or flip chip direct attach.

27. The package structure as claimed in claim 22, further comprising a molding compound covering the top surface of the selective electroplating epoxy compound.

28. The package structure as claimed in claim 27, wherein the selective electroplating epoxy compound comprises a plurality of dimples located on the top surface of the selective electroplating epoxy compound and the molding compound is filled in the dimples.

29. The package structure as claimed in claim 22, further comprising a plurality of second conducive vias, the selective electroplating epoxy compound covers a peripheral region of the chip pad surrounding the concave, and the second conductive vias are embedded in the selective electroplating epoxy compound and connected to the peripheral region of the chip pad.

30. The package structure as claimed in claim 29, wherein at least one of the second conducive vias comprises a second lower segment connected to the peripheral region of the chip pad and a second upper segment connected to the second lower segment and extended to the top surface, and a smallest diameter of the second upper segment is greater than a largest diameter of the second lower segment.

31. The package structure as claimed in claim 29, further comprising a second patterned circuit layer directly disposed on the top surface and electrically connected to the second conductive vias.

32. The package structure as claimed in claim 31, further comprising at least one chip disposed in the concave, wherein the chip is electrically connected to the second patterned circuit layer by wire bonding or flip chip direct attach.

33. The package structure as claimed in claim 22, further comprising at least one chip disposed on the chip pad and located in the opening, wherein the chip is electrically connected to the first conductive vias and the first patterned circuit layer.

34. The package structure as claimed in claim 33, wherein the chip is electrically connected to the first patterned circuit layer by wire bonding or flip chip direct attach.

35. The package structure as claimed in claim 22, further comprising a bottom patterned circuit layer disposed on a bottom surface of the selective electroplating epoxy compound and electrically connected to the metal stud array.

36. A package structure, comprising:
a lead frame comprising a plurality of output leads;
a selective electroplating epoxy compound covering the output leads and exposed a lower surface of the lead frame, wherein the selective electroplating epoxy compound comprises at least one cavity and at least one stepped portion protruded from a bottom surface and a side surface of the cavity, the stepped portion comprises a slanted surface extended from a top surface of the stepped portion to the bottom surface, and a material of the selective electroplating epoxy compound comprises non-conductive metal complex;
a first patterned circuit layer directly disposed on the top surface of the stepped portion and extended to the bottom surface of the cavity via the slanted surface;
a second patterned circuit layer directly disposed on the bottom surface of the cavity;
at least one chip disposed in the cavity;
a plurality of wires connecting the chip to the stepped portion and the bottom surface to electrically connecting the chip to the first patterned circuit layer and the second patterned circuit layer; and
a first conductive via penetrating the selective electroplating epoxy compound to connect the first patterned circuit layer and the output leads.

37. The package structure as claimed in claim 36, wherein the non-conductive metal complex comprises palladium (Pd), chromium, or copper complex.

38. The package structure as claimed in claim 36, wherein the selective electroplating epoxy compound is configured to be selectively irradiated by laser or ultraviolet (UV) light to selectively metallize the non-conductive metal complex.

39. The package structure as claimed in claim 36, further comprising a third patterned circuit layer, wherein the selective electroplating epoxy compound comprises a first surface and a second surface opposite to the first surface, the cavity is disposed on the first surface and the third patterned circuit layer is directly disposed on the second surface and electrically connected to at least one of the output leads.

40. The package structure as claimed in claim 39, further comprising at least one second conductive via, and each of the output leads comprising a flange portion protruded from a side surface the corresponding output lead, and second conductive via penetrating the selective electroplating epoxy compound to connect the third patterned circuit layer to one of the flange portions.

41. The package structure as claimed in claim 39, further comprising at least one third conductive via penetrating the selective electroplating epoxy compound to connect the second patterned circuit layer and the third patterned circuit layer.

* * * * *

UNITED STATES PATENT AND TRADEMARK OFFICE
CERTIFICATE OF CORRECTION

| | | |
|---|---|---|
| PATENT NO. | : 9,508,634 B2 | Page 1 of 1 |
| APPLICATION NO. | : 15/133244 | |
| DATED | : November 29, 2016 | |
| INVENTOR(S) | : Wen-Chun Liu | |

It is certified that error appears in the above-identified patent and that said Letters Patent is hereby corrected as shown below:

On the Title Page

Insert --(30) Foreign Application Priority Data

Jun. 24, 2014 (TW) .................... 103121829--

Signed and Sealed this
Fourteenth Day of March, 2017

Michelle K. Lee
*Director of the United States Patent and Trademark Office*